(12) United States Patent
Katti

(10) Patent No.: US 8,411,493 B2
(45) Date of Patent: Apr. 2, 2013

(54) SELECTION DEVICE FOR A SPIN-TORQUE TRANSFER MAGNETIC RANDOM ACCESS MEMORY

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 449 days.

(21) Appl. No.: 12/610,158

(22) Filed: Oct. 30, 2009

(65) Prior Publication Data

US 2012/0287708 A1 Nov. 15, 2012

(51) Int. Cl.
  *G11C 11/00* (2006.01)
(52) U.S. Cl. ........................................ 365/158
(58) Field of Classification Search .................. 365/158, 365/148
  See application file for complete search history.

(56) References Cited

U.S. PATENT DOCUMENTS

| | | | |
|---|---|---|---|
| 5,024,965 A * | 6/1991 | Chang et al. | 438/154 |
| 6,545,906 B1 | 4/2003 | Savtchenko et al. | |
| 6,614,280 B1 * | 9/2003 | Panwitz | 327/307 |
| 6,633,498 B1 | 10/2003 | Engel et al. | |
| 6,812,091 B1 | 11/2004 | Gruening et al. | |
| 6,905,614 B1 | 6/2005 | Novotny | |
| 6,914,710 B1 | 7/2005 | Novotny et al. | |
| 7,119,410 B2 | 10/2006 | Saito et al. | |
| 7,230,844 B2 | 6/2007 | Deak | |
| 7,272,034 B1 * | 9/2007 | Chen et al. | 365/158 |
| 7,881,098 B2 * | 2/2011 | Xi et al. | 365/158 |
| 2002/0134916 A1 * | 9/2002 | Bird | 250/208.1 |
| 2005/0242382 A1 | 11/2005 | Daughton et al. | |
| 2006/0081952 A1 | 4/2006 | Lin | |
| 2007/0171694 A1 | 7/2007 | Huai et al. | |
| 2007/0176251 A1 | 8/2007 | Oh et al. | |
| 2007/0246787 A1 | 10/2007 | Wang et al. | |
| 2007/0279963 A1 | 12/2007 | Tsuchida et al. | |
| 2007/0297223 A1 | 12/2007 | Chen | |
| 2008/0043514 A1 | 2/2008 | Ueda | |
| 2008/0061388 A1 | 3/2008 | Diao et al. | |
| 2008/0219043 A1 * | 9/2008 | Yoon et al. | 365/158 |

(Continued)

FOREIGN PATENT DOCUMENTS

| | | |
|---|---|---|
| EP | 0776046 | 5/1997 |
| WO | WO2007100626 | 9/2007 |

(Continued)

OTHER PUBLICATIONS

Communication from corresponding EP Application No. 10172703.0, mailed Oct. 1, 2010, 5 pages.

(Continued)

*Primary Examiner* — Hoai V Ho
*Assistant Examiner* — Min Huang
(74) *Attorney, Agent, or Firm* — Shumaker & Sieffert, P.A.

(57) ABSTRACT

A spin-torque transfer magnetic random access memory (STT-MRAM) that includes a magnetic bit coupled between a first conductor line and a selection device. The selection device includes at least two transistors. The selection device is operative to (a) select the magnetic bit for a spin-torque transfer (STT) write operation when the at least two transistors are in a first state and (b) select the magnetic bit for a read operation when the at least two transistors are in a second state. The selection device may be implemented in silicon-on-insulator (SOI) complementary metal-oxide-semiconductor (CMOS) technology, and the transistors may include body ties. The selection device may also be radiation hardened.

14 Claims, 4 Drawing Sheets

U.S. PATENT DOCUMENTS

| | | |
|---|---|---|
| 2008/0229269 A1 | 9/2008 | Lamorey |
| 2008/0232002 A1 | 9/2008 | Mather et al. |
| 2008/0310213 A1 | 12/2008 | Chen et al. |
| 2008/0310215 A1 | 12/2008 | Ueda |
| 2009/0059659 A1 | 3/2009 | Inokuchi et al. |
| 2011/0228594 A1* | 9/2011 | Rao et al. ............... 365/158 |

FOREIGN PATENT DOCUMENTS

| | | |
|---|---|---|
| WO | WO2008112746 | 9/2008 |

OTHER PUBLICATIONS

Reply to communication from the Examining Division, for EP Application No. 10172703.0, dated May 19, 2011, 13 pages.

Bo-Ting Wang et al. "A Novel Low-Voltage Silicon-On-Insulator (SOI) CMOS Complementary Pass-Transistor Logic (CPL) Circuit Using Asymmetrical Dynamic Threshold Pass-Transistor (ADTPT) Technique," IEEE pp. 694-697 (2000).

Jean-Luc Pelloie, "SOI CMOS Requires Complex Modeling" http://www.eetimes.com (2002).

European Examination Report from corresponding EP Application No. 10172703.0, mailed Jan. 25, 2011, 6 pages.

European Search Report from corresponding EP Application No. 10172703.0, mailed Jan. 17, 2011, 5 pages.

Andre et al., "A 4-Mb 0.18-μm 1T1MTJ Toggle MRAM With Balanced Three Input Sensing Scheme and Locally Mirrored Unidirectional Write Drivers," IEEE Journal of Solid-State Circuits, vol. 40, No. 1, pp. 301-309, Jan. 2005.

Kagami et al., "A Performance Study of Next Generation's TMR Heads Beyond 200 Gb/in2," IEEE Transactions on Magnetics, vol. 42, No. 2, pp. 93-96, Feb. 2006.

Katti, "Current-In-Plane Pseudo-Spin-Valve Device Performance for Giant Magnetoresistive Random Access Memory Applications (Invited)," Journal of Applied Physics, vol. 91, No. 10, 7 pages, May 15, 2002.

Mao et al., "Commercial TMR Heads for Hard Disk Drives: Characterization and Extendibility At 300 Gbit/in2," IEEE Transactions on Magnetics, vol. 42, No. 2, pp. 97-102, Feb. 2006.

Katti, "Giant Magneto-Resistive Random-Access Memories Based on Current-In-Plane Devices," Applications of Nanomagnetism (part of a document entitled, "Ultrathin Magnetic Structures IV"), 36 pages, 2005.

Durlam et al., "A 0.18μm 4Mb Toggling MRAM," IEDM Tech Digest, 2003, pp. 34.6.1-34.6.3.

Dave et al., "MgO-Based Tunnel Junction Material for High-Speed Toggle Magnetic Random Access Memory," IEEE Transactions on Magnetics vol. 42, No. 8, Aug. 2006, pp. 1935-1939.

WTEC Workshop on Spin-Electronics, held on Nov. 2, 2001, Chapter 5 by Michael Roukes: Fabrication and Characterization of Magnetic Nanostructures, slides 15, 21, 22, 25.

WTEC Workshop on Spin-Electronics, held on Nov. 2, 2001, Chapter 6 by Robert Buhrman: Electronic Spin Injection and Spin Transport Research, slides 4, 10, 11, 12, 23, 24, 25.

WTEC Workshop on Spin-Electronics, held on Nov. 2, 2001, Chapter 8 by James Daughton: Magneto-Electronics and Devices, slides 3, 4, 5, 6, 10, 11, 12.

Johnson, "Overview of Spin Transport Electronics in Metals," Proceedings of the IEEE, vol. 91, No. 5, May 2003, pp. 652-660.

Parkin et al., "Magnetically Engineered Spintronic Sensors and Memory," Proceedings of the IEEE, vol. 91, No. 5, May 2003, pp. 661-680.

Daughton, "Spin-Dependent Sensors," Proceedings of the IEEE, vol. 91, No. 5, May 2003, pp. 681-686.

Katti, "Giant Magnetoresistive Random-Access Memories Based on Current-in-Place Devices," Proceedings of the IEEE, vol. 91, No. 5, May 2003, pp. 687-702.

Tehrani et al., "Magnetoresistive Random Access Memory Using Magnetic Tunnel Junctions," Proceedings of the IEEE, vol. 91, No. 5, May 2003, pp. 703-714.

Von Molnar et al., "New Materials for Semiconductor Spin-Electronics," Proceedings of the IEEE, vol. 91, No. 5, May 2003, pp. 715-726.

Katti, "Magnetic Memories," Chapter 13, Nonvolatile Memory Technologies with Emphasis on Flash, edited by J.E. Brewer and M. Gill, IEEE Press and John Wiley and Sons, 2008, pp. 678-689.

Gurney et al., "Spin Valve Giant Magnetoresistive Sensor Materials for Hard Disk Drives," Chapter 6, Ultrathin Magnetic Structures, Application of Nanomagnetism, vol. IV, edited by B. Heinrich and J.A.C. Bland, 2005, pp. 149-175.

Shi, "Magnetic Switching in High Density MRAM," Chapter 7, Ultrathin Magnetic Structures, Application of Nanomagnetism, vol. IV, edited by B. Heinrich and J.A.C. Bland, 2005, pp. 177-218.

Katti, "Giant Magneto-resistive Random-Access Memories Based on Current-in-Plane Devices," Ultrathin Magnetic Structures, Application of Nanomagnetism, vol. IV, edited by B. Heinrich and J.A.C. Bland, 2005, pp. 219-252.

Bertram, "Fundamentals of the Magnetic Recording," Proceedings of the IEEE. vol. 74, No. 11, Nov. 1986, pp. 1494-1512.

Jeffers, "High-Density Magnetic Recording Heads," Proceedings of the IEEE. vol. 74, No. 11, Nov. 1986, pp. 1540-1556.

Jones et al., "Recording Heads," Chapter 4, Magnetic Recording, vol. I, edited by C.D. Mee and E.D. Daniels, 1987, pp. 244-336.

Gallagher et al., "Development of the magnetic tunnel junction MRAM at IBM: From first junctions to a 16-Mb MRAM demonstrator chip," IBM J. Res. & Dev., vol. 50, No. 1, Jan. 2006, pp. 5-23.

Maffitt et al., "Design Considerations for MRAM," IBM J. Res. & Dev., vol. 50, No. 1, Jan. 2006, pp. 25-39.

Abraham et al., "Rapid-turnaround characterization methods for MRAM development," IBM J. Res. & Dev., vol. 50, No. 1, Jan. 2006, pp. 55-67.

Worledge," Single-domain model for toggle MRAM," IBM J. Res. & Dev., vol. 50, No. 1, Jan. 2006, pp. 69-79.

Sun, "Spin angular momentum transfer in current-perpendicular nanomagnetic junctions," IBM J. Res. & Dev., vol. 50, No. 1, Jan. 2006, pp. 81-100.

* cited by examiner

SELECTION DEVICE FOR A SPIN-TORQUE TRANSFER MAGNETIC RANDOM ACCESS MEMORY

GOVERNMENT RIGHTS

The United States Government has acquired certain rights in this invention pursuant to Contract No. N00030-08-C-0010 with the Department of the Navy.

BACKGROUND

Magnetic Random Access Memory (MRAM) is a non-volatile memory technology that is gaining popularity in the computer market. Unlike other memory technologies (e.g., SRAM, DRAM, FLASH, etc.) that store data as electric charge or current flows, MRAM stores data as a magnetic state in magnetoresistive storage elements. Typically, a magnetic bit includes two ferromagnetic layers (or structures), each of which can hold a magnetic field that has one of two possible polarities. One popular example of magnetic bit is a magnetic tunnel junction (MTJ), which includes a free magnetic layer for data storage and a pinned magnetic layer for reference, separated by a thin insulating barrier layer through which a tunneling current may flow. The logic state of MTJ depends on a relative polarity of the free and pinned magnetic layers. For example, if the free and pinned magnetic layers have the same polarity, the MTJ may be storing a logic state "0." As another example, if the free and pinned magnetic layers have an opposite polarity, the MTJ may be storing a logic state "1."

The MRAM may determine ("read") the logic state of a given magnetic bit by passing a read current through the given magnetic bit and then determining a resistance of the given magnetic bit, which indicates the relative polarity of the free and pinned magnetic layers (e.g., a lower resistance typically indicates the same relative polarity and a higher resistance typically indicates an opposite relative polarity). In one example, the MRAM may pass the read current through the given magnetic bit by sending the current through a conductor (e.g., a bit line) coupled to one side of the given magnetic bit and switching on a selection transistor coupled to the other side of the given magnetic bit, and the MRAM may determine the resistance of the given magnetic bit by measuring the resulting current and/or voltage. Other examples for reading the given magnetic bit may exist as well.

The MRAM may store ("write") data to a given magnetic bit using a few different techniques. According to one technique, the MRAM may write data to the given magnetic bit by applying magnetic fields that couple to the given magnetic bit's free magnetic layer. The MRAM may generate these magnetic fields via write currents running through conductors arranged above and below the given magnetic bit. In one example, an MRAM may include a first write line arranged above the given magnetic bit and oriented in a first direction and a second write line arranged below the given magnetic bit and oriented in a second direction that is perpendicular to the first direction.

According to another technique known as spin-torque transfer (STT), the MRAM may write data to the given magnetic bit by passing a spin-polarized current through the given magnetic bit that is capable of changing the polarity of the given magnetic bit's free layer. In this respect, if the spin-polarized current electrons have to change their spin upon entering the given magnetic bit, those electrons may generate a torque that changes the polarity of the given magnetic bit's free layer. In one example, the MRAM may pass the spin-polarized current through the given magnetic bit by sending the current through a conductor (e.g., a bit line) coupled to one side of the given magnetic bit and switching on a selection transistor coupled to the other side of the given magnetic bit. Typically, an MRAM employing STT uses the same conductor and selection transistor for reading and writing the given magnetic bit.

An MRAM with STT magnetic bits may demonstrate various benefits over other MRAMs, such as higher magnetoresistance, higher signal levels, and lower write currents. However, an improved structure for reading and writing STT magnetic bits is desirable.

SUMMARY

Unless clearly indicated by the context, different examples of the invention can be used together.

Disclosed herein is a spin-torque transfer magnetic random access memory (STT-MRAM) that includes a magnetic bit coupled between a first conductor line and a selection device that includes at least two transistors. The selection device is operative to (a) select the magnetic bit for a spin-torque transfer (STT) write operation when the at least two transistors are in a first state and (b) select the magnetic bit for a read operation when the at least two transistors are in a second state. The selection device may also be operative to (a) couple a given transistor to a write architecture when the at least two transistors are in the first state and (b) couple the given transistor to a read architecture when the at least two transistors are in the second state. The selection device may be implemented in silicon-on-insulator (SOI) complementary metal-oxide-semiconductor (CMOS) technology, and the transistors may include a body tie. The selection device may also be radiation hardened.

In one aspect, the selection device may include a first transistor and a second transistor arranged in a parallel configuration. In this configuration, in one example, the first transistor is enabled and the second transistor is disabled in the first state, and the first transistor is disabled and the second transistor is enabled in the second state. In another example, the first transistor and the second transistor are enabled in the first state, and the first transistor is disabled and the second transistor is enabled in the second state.

In another aspect, the selection device may include a first transistor and a second transistor arranged in a series configuration. In this configuration, in one example, the first transistor and the second transistor are fully enabled in the first state, and the first transistor and the second transistor are partially enabled in the second state. In another example, the first transistor and the second transistor are fully enabled in the first state, and the first transistor partially enabled and the second transistor is fully enabled in the second state.

In yet another aspect, the selection device may include a first transistor and a second transistor arranged in a first series configuration and a third transistor and a fourth transistor arranged in a second series configuration, where the first series configuration and the second series configuration are arranged in a parallel configuration. In this configuration, in one example, the first transistor and the second transistor are fully enabled and the third transistor and the fourth transistor are disabled in the first state, and the first transistor and the second transistor are disabled and the third transistor and the fourth transistor are fully enabled in the second state. In another example, the first transistor, the second transistor, the third transistor, and the fourth transistor are fully enabled in the first state, and the first transistor and the second transistor are disabled and the third transistor and the fourth transistor are partially enabled in the second state.

Also disclosed herein is a STT-MRAM that includes a magnetic bit coupled between a first conductor line and a selection device that includes a first transistor and a second transistor arranged in a parallel configuration. The selection device is operative to (a) select the magnetic bit for a STT-write operation when the first transistor is enabled and the second transistor is disabled and (b) select the magnetic bit for a read operation when the first transistor is disabled and the second transistor is enabled.

Also disclosed herein is a STT-MRAM that includes a magnetic bit coupled between a first conductor line and a selection device that includes a first transistor and a second transistor arranged in a series configuration. The selection device is operative to (a) select the magnetic bit for a STT-write operation when the first transistor and the second transistor are fully enabled and (b) select the magnetic bit for a read operation when the first transistor is partially enabled and the second transistor is at least partially enabled.

These as well as other aspects and advantages will become apparent to those of ordinary skill in the art by reading the following detailed description, with reference where appropriate to the accompanying drawings. Further, it should be understood that the embodiments described in this summary and elsewhere are intended to be examples only and do not necessarily limit the scope of the invention.

DETAILED DESCRIPTION

Figure 1:
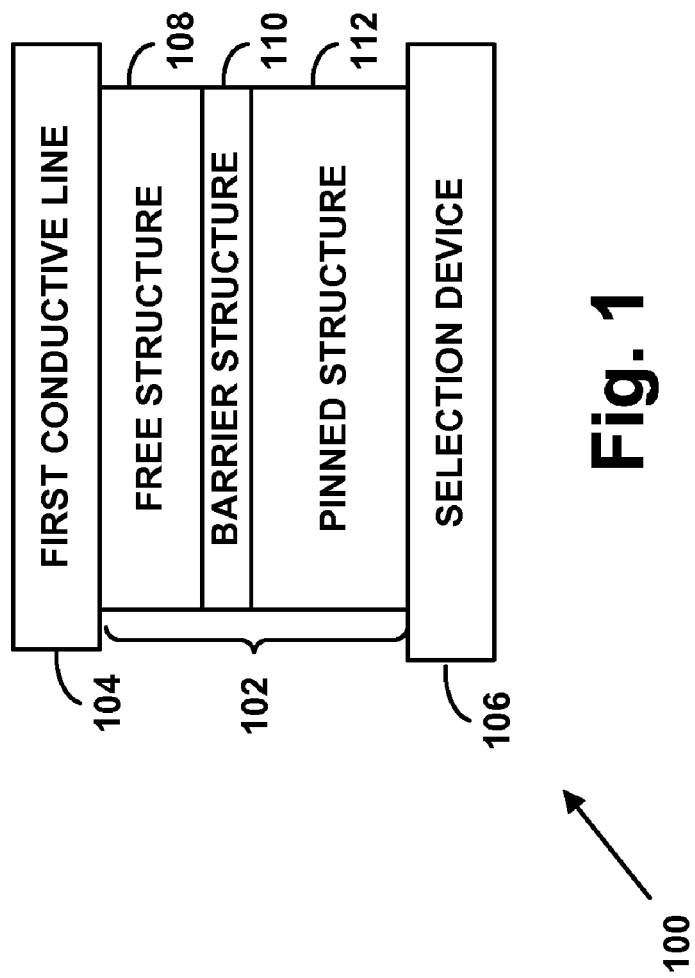
FIG. 1 depicts an exemplary a spin-torque transfer magnetic random access memory (STT-MRAM)

Referring to the drawings, FIG. 1 depicts an exemplary a spin-torque transfer magnetic random access memory (STT-MRAM) 100. As shown, the STT-MRAM 100 may include a STT magnetic bit 102 coupled between a first conductor line 104 and a selection device 106 that includes at least two transistors. It should be understood, however, that this and other arrangements described herein are set forth for purposes of example only, and that the STT-MRAM 100 may include additional elements. For example, the STT-MRAM 100 may include a plurality of STT magnetic bits that are substantially similar to the STT magnetic bit 102, and these STT magnetic bits may be arranged into columns and rows. As another example, the STT-MRAM 100 may include various other layers that are not depicted in FIG. 1, including metal layers and/or vias coupled between the STT magnetic bit 102 and either the first conductor line 104 or the selection device 106. As yet another example, the STT-MRAM 100 may include write architecture that facilitates a write operation on STT magnetic bits and read architecture that facilitates a read operation on STT magnetic bits. Other examples are possible as well.

The STT magnetic bit 102 may include at least a free magnetic structure 108, a barrier structure 110, and a pinned magnetic structure 112. The barrier structure 110 may be coupled between the free magnetic structure 108 and the pinned magnetic structure 112, such that the free magnetic structure 108 is coupled to a first side of the barrier structure 110 and the pinned magnetic structure 112 is coupled to a second side of the barrier structure 110.

The free magnetic structure 108 may include a ferromagnetic structure having a magnetic moment vector that may change polarities in response to a spin-polarized current. In one example, the free magnetic structure 108 may be a single ferromagnetic layer, such as a layer of Nickel Iron Cobalt (NiFeCo) with a thickness of approximately 2 nm. As another example, the free magnetic structure 108 may be a multi-layer structure, such as a synthetic anti-ferromagnetic structure (SAF) that includes two or more anti-ferromagnetically coupled ferromagnetic layers. For instance, the free layer structure 108 may be a tri-layer structure consisting of two layers of NiFeCo with a thickness of 1 nm sandwiching a layer of Ru with a thickness of 1 nm. Many other examples for the free magnetic structure 108 may be used as well.

The barrier structure 110 may be a non-magnetic structure that separates the free magnetic structure 108 and the pinned magnetic structure 112. As one example, the barrier structure 110 may be an electrically insulating layer that is sufficiently thin to allow tunneling of charge carriers between the free magnetic structure 108 and the pinned magnetic structure 112, thus forming a magnetic tunnel junction (MTJ) between the free magnetic structure 108 and the pinned magnetic structure 112. In this respect, the barrier structure 110 may be a layer of dielectric material such as Aluminum Oxide ($AlO_x$) or Magnesium Oxide (MgO). As another example, the barrier structure 110 may be a multi-layer structure. Many other examples for the barrier structure 110 may be used as well.

The pinned magnetic structure 112 may include a ferromagnetic structure having a magnetic moment vector and an anti-ferromagnetic structure to fix the magnetic moment vector to a known polarity. In one example, the pinned magnetic structure 112 may include a ferromagnetic layer of NiFeCo with a thickness of approximately 2 nm and an anti-ferromagnetic layer of Iron Manganese (FeMn) with a thickness of approximately 5-10 nm. In another example, the ferromagnetic and/or anti-ferromagnetic structures of the pinned magnetic structure 112 may be multi-layer structures as opposed to single layer structures. For instance, the ferromagnetic structure of the pinned magnetic structure 108 may be a multi-layer SAF, such as the SAF described above with reference to the free magnetic structure 108. Many other examples for the pinned magnetic structure 112 may be used as well.

The first conductor line 104 may be any line capable of carrying current to the STT magnetic bit 102. In particular, the first conductor line 104 may be any line capable of carrying a read current to the STT magnetic bit 102 during a read operation and a spin-polarized current to the STT magnetic bit 102 during a STT-write operation. In one example, the first conductor line 104 may be coupled to a plurality of other STT magnetic bits that are substantially similar to the STT magnetic bit 102.

The selection device 106 will include at least two transistors, which may be arranged in various configurations. The selection device 106 will be operative to (a) select the magnetic bit for a STT-write operation when the at least two transistors are in a first state and (b) select the magnetic bit for a read operation when the at least two transistors are in a second state. In a preferred example, the selection device 106 will be implemented in silicon-on-insulator (SOI) complementary metal-oxide-semiconductor (CMOS) technology. In this respect, a SOI CMOS fabrication process may be integrated with a magnetics fabrication process to form the exemplary STT-MRAM 100. In another example, the selection device 106 may be implemented in bulk CMOS technology. In either example, the selection device 106 may be radiation hardened.

Figure 2A:
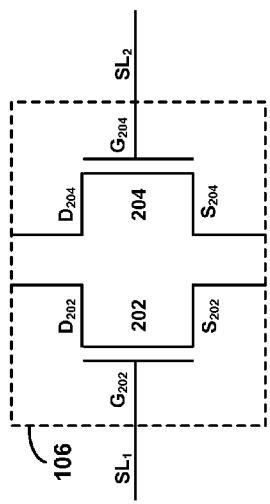
FIG. 2 depicts exemplary selection devices of the exemplary STT-MRAM.

FIG. 2(a) depicts a first exemplary selection device 106 with two transistors arranged in a parallel configuration. As shown, the first exemplary selection device 106 may include (1) a first transistor 202 having a first gate $G_{202}$, a first drain $D_{202}$, and a first source $S_{202}$ and (2) a second transistor 204 having a second gate $G_{204}$, a second drain $D_{204}$, and a second source $S_{204}$. The first and second transistors 202 and 204 may also have body ties (not shown). The first gate $G_{202}$ may be coupled to a first selection line $SL_1$, the second gate $G_{204}$ may be coupled to a second selection line $SL_2$, the drains $D_{202}$ and $D_{204}$ may be coupled to the STT magnetic bit 102, and the sources $S_{202}$ and $S_{204}$ may be coupled to write architecture (e.g., ground) and/or read architecture (e.g., ground and/or a sense amp), depending on the configuration. Although not shown, the first gate $G_{202}$ may also be coupled to the first drain $D_{202}$ and/or the first source $S_{202}$, and the second gate $G_{204}$ may also be coupled to the second drain $D_{204}$ and/or the second source $S_{204}$. Other connections are possible as well.

In one configuration, the first source $S_{202}$ may be coupled to the write architecture and the second source $S_{204}$ may be coupled to the read architecture. Within this configuration, the selection device 106 may be in a first state—and thus select the STT magnetic bit 102 for a STT-write operation—when the first transistor 202 is enabled and the second transistor 204 is disabled. For instance, the selection device 106 may be in a first state when the first gate $G_{202}$ is set to a high voltage via the first selection line $SL_1$ and the second gate $G_{204}$ is set to a low voltage via the second selection line $SL_2$. In turn, the selection device 106 may be in a second state—and thus select the STT magnetic bit 102 for a read operation—when the first transistor 202 is disabled and the second transistor 204 is enabled. For instance, the selection device 106 may be in a second state when the first gate $G_{202}$ is set to a low voltage via the first selection line $SL_1$ and the second gate $G_{204}$ is set to a high voltage via the second selection line $SL_2$. Other examples are possible as well.

In another configuration, the first source $S_{202}$ may be coupled to write architecture and the second source $S_{204}$ may be coupled to either the write architecture or the read architecture depending on the state of the selection device 106. In this respect, the selection device 106 may additionally include a controlled switch (e.g., a demultiplexer controlled by selection lines $SL_1$ and $SL_2$) that facilitates the coupling of the second source $S_{204}$ to write architecture or the read architecture. Within this configuration, the selection device 106 may be in a first state—and thus select the STT magnetic bit 102 for a STT-write operation—when the first and second transistors 202 and 204 are both enabled and the second source $S_{204}$ is coupled to the write architecture. For instance, the selection device 106 may be in a first state when the first and second gates $G_{202}$ and $G_{204}$ are both set to a high voltage and the controlled switch selects the write architecture. In turn, the selection device 106 may be in a second state—and thus select the STT magnetic bit 102 for a read operation—when the first transistor 202 is disabled, the second transistor 204 is enabled, and the second source $S_{204}$ is coupled to the write architecture. For instance, the selection device 106 may be in a second state when the first transistor's gate $G_{202}$ is set to a low voltage via the first selection line $SL_1$, the second transistor's gate $G_{204}$ is set to a high voltage via the second selection line $SL_2$, and the controlled switch selects the read architecture. Other examples are possible as well.

Figure 2C:
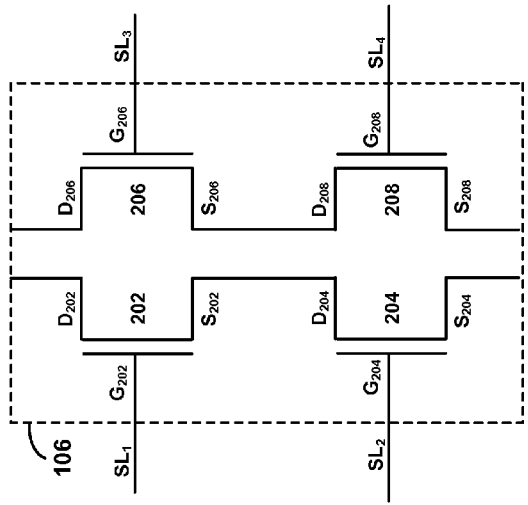
Figure 2B:
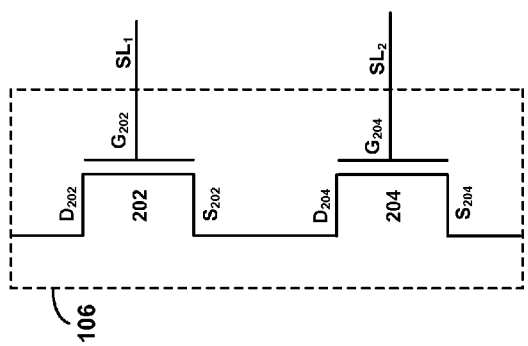

FIG. 2(b) depicts a second exemplary selection device 106 with two transistors arranged in a series configuration. As shown, the second exemplary selection device 106 may include (1) a first transistor 202 having a first gate $G_{202}$, a first drain $D_{202}$, and a first source $S_{202}$ and (2) a second transistor 204 having a second gate $G_{204}$, a second drain $D_{204}$, and a second source $S_{204}$. The first and second transistors 202 and 204 may also have body ties (not shown). The first gate $G_{202}$ may be coupled to a first selection line $SL_1$, the second gate $G_{204}$ may be coupled to a second selection line $SL_2$, the first drain $D_{202}$ may be coupled to the STT magnetic bit 102, the first source $S_{202}$ may be coupled to the second drain $D_{204}$, the second source $S_{204}$ may be coupled to either the write architecture or the read architecture depending on the state of the selection device 106. In this respect, the second exemplary selection device 106 may additionally include a controlled switch that facilitates the coupling of the second source $S_{204}$ to write architecture or the read architecture. Although not shown, the first gate $G_{202}$ may also be coupled to the first drain $D_{202}$ and/or the first source $S_{202}$, the second gate $G_{204}$ may also be coupled to the second drain $D_{204}$ and/or the second source $S_{204}$, and the first source $S_{202}$ and second drain $D_{204}$ may also be coupled to a third selection line $SL_3$. Other connections are possible as well.

Within this configuration, the selection device 106 may be in a first state—and thus select the STT magnetic bit 102 for a STT-write operation—when the first transistor 202 and the second transistor 204 are both fully enabled and the second source $S_{204}$ is coupled to the write architecture. For instance, the selection device 106 may be in a first state when the first and second gates $G_{202}$ and $G_{204}$ are both set to a high voltage and the controlled switch selects the write architecture. In turn, the selection device 106 may be in a second state—and thus select the STT magnetic bit 102 for a read operation—when the first and second transistors 202 and 204 are both at least partially enabled but not both fully enabled and the second source $S_{204}$ is coupled to the read architecture. For instance, the selection device 106 may be in a second state when the first gate $G_{202}$ is set to an intermediate voltage (i.e., a voltage value between a transistor's threshold voltage and the high voltage) via the first selection line $SL_1$, the second gate $G_{204}$ is set to a high voltage via the second selection line $SL_2$, and the controlled switch selects the read architecture. Alternatively, the selection device 106 may be in a second state when the first gate $G_{202}$ is set to high voltage via the first selection line $SL_1$, the second gate $G_{204}$ is set to an intermediate voltage via the second selection line $SL_2$, and the controlled switch selects the read architecture. Alternatively yet, the selection device 106 may be in a second state when the first and second gates $G_{202}$ and $G_{204}$ are both set to an intermediate voltage and the controlled switch selects the read architecture. Other examples are possible as well.

FIG. 2(c) depicts a third exemplary selection device 106 with two transistors arranged in a first series configuration and two transistors arranged in a second series configuration, where the first and second series configurations are arranged in a parallel configuration. As shown, the third exemplary selection device 106 may include (1) a first transistor 202 having a gate $G_{202}$, a drain $D_{202}$, and a source $S_{202}$, (2) a second transistor 204 having a gate $G_{204}$, a drain $D_{204}$, and a source $S_{204}$, (3) a third transistor 206 having a gate $G_{206}$, a drain $D_{206}$, and a source $S_{206}$, and (4) a fourth transistor 208 having a gate $G_{208}$, a drain $D_{208}$, and a source $S_{208}$. The transistors 202, 204, 206, and 208 may also have body ties (not shown).

In the first series configuration, the first gate $G_{202}$ may be coupled to a first selection line $SL_1$, the second gate G204 may be coupled to a second selection line $SL_2$, the first drain $D_{202}$ may be coupled to the STT magnetic bit 102, the first source $D_{202}$ may be coupled to the second drain $D_{204}$, and the second source $S_{204}$ may be coupled to write architecture and/or read architecture, depending on the configuration. Similarly, in the second series configuration, the third gate $G_{206}$ may be coupled to a third selection line $SL_3$, and the fourth gate $G_{208}$ may be coupled to a fourth selection line $SL_4$, the third drain $D_{206}$ may be coupled to the STT magnetic bit 102, the third source $S_{206}$ may be coupled to the fourth drain $D_{208}$, and the fourth source $S_{208}$ may be coupled to write architecture and/or read architecture, depending on the configuration. Although not shown, the first gate $G_{202}$ may also be coupled to the first drain $D_{202}$ and/or the first source $S_{202}$, the second gate $G_{204}$ may also be coupled to the second drain $D_{204}$ and/or the second source $S_{204}$, the third gate $G_{206}$ may also be coupled to the third drain $D_{206}$ and/or the third source $S_{206}$, and the fourth gate $G_{208}$ may also be coupled to the fourth drain $D_{208}$ and/or the fourth source $S_{208}$. Other connections are possible as well.

In one configuration, the second source $S_{204}$ may be coupled to the write architecture and the fourth source $S_{208}$ may be coupled to the read architecture. Within this configuration, the selection device 106 may be in a first state—and thus select the STT magnetic bit 102 for a STT-write operation—when the transistors in the first series configuration are fully enabled and the transistors in the second series configuration are disabled. For instance, the selection device 106 may be in a first state when the first and second gates $G_{202}$ and $G_{204}$ are set to a high voltage and the third and fourth gates $G_{206}$ and $G_{208}$ are set to a low voltage. In turn, the selection device 106 may be in a second state—and thus select the STT magnetic bit 102 for a read operation—when the transistors in the first series configuration are disabled and the transistors in the second series configuration are fully enabled. For instance, the selection device 106 may be in a second state when the first and second gates $G_{202}$ and $G_{204}$ are set to a low voltage and the third and fourth gates $G_{206}$ and $G_{208}$ are set to a high voltage. Other examples are possible as well.

In another configuration, the second source $S_{204}$ may be coupled to the write architecture and the fourth source $S_{208}$ may be coupled to either the write architecture or the read architecture depending on the state of the selection device 106. In this respect, the selection device 106 may additionally include a controlled switch that facilitates the coupling of the fourth source $S_{208}$ to the write architecture or the read architecture. Within this configuration, the selection device 106 may be in a first state—and thus select the STT magnetic bit 102 for a STT-write operation—when the transistors in the first series configuration are fully enabled, the transistors in the second series configuration are at least partially enabled, and the fourth source $S_{208}$ is coupled to the write architecture. For instance, the selection device 106 may be in a first state when the first and second gates $G_{202}$ and $G_{204}$ are both set to a high voltage, the third and fourth gates $G_{206}$ and $G_{208}$ are set to at least an intermediate voltage, and the controlled switch selects the write architecture. In turn, the selection device 106 may be in a second state—and thus select the STT magnetic bit 102 for a read operation—when the transistors in the first series configuration are disabled, the transistors in the second series configuration are at least partially enabled, and the fourth source $S_{208}$ is coupled to the read architecture. For instance, the selection device 106 may be in a second state when the first and second gates $G_{202}$ and $G_{204}$ are set to a low voltage, the third and fourth gates $G_{206}$ and $G_{204}$ are set to at least an intermediate voltage, and the controlled switch selects the read architecture. Other examples are possible as well.

In yet another configuration, the second source $S_{204}$ and the fourth source $S_{208}$ may both be coupled to either the write architecture or the read architecture depending on the state of the selection device 106. In this respect, the selection device 106 may additionally include at least one controlled switch that facilitates the coupling of the second and fourth sources $S_{204}$ and $S_{208}$ to the write architecture or the read architecture. Within this configuration, the selection device 106 may be in a first state—and thus select the STT magnetic bit 102 for a STT-write operation—when the transistors in the first series configuration and the second series configuration are all fully enabled and the second and fourth sources $S_{204}$ and $S_{208}$ are both coupled to the write architecture. For instance, the selection device 106 may be in a first state when the first, second, third, and fourth gates $G_{202}$, $G_{204}$, $G_{206}$, and $G_{208}$ are all set to a high voltage and the controlled switch selects the write architecture. In turn, the selection device 106 may be in a second state—and thus select the STT magnetic bit 102 for a read operation—when the transistors in the first series configuration are both at least partially enabled but not both fully enabled, the transistors in the second series configuration are both at least partially enabled but not both fully enabled, and the second and fourth sources $S_{204}$ and $S_{208}$ are both coupled to the read architecture. For instance, the selection device 106 may be in a second state when the first, second, third, and fourth gates $G_{202}$, $G_{204}$, $G_{206}$, and $G_{208}$ are all set to at least an intermediate voltage (but not all set to a high voltage) and the controlled switch selects the read architecture. Other examples are possible as well.

Advantageously, the selection device 106 described herein may improve a STT-write operation and read operation for a STT-MRAM. For example, the selection device 106 described herein may allow a wider range of currents to be utilized for the STT-write and read operations, which may in turn allow more optimized STT-write and read operations. As another example, the selection device 106 described in FIG. 2(*a*) above may reduce the series resistance of the selection device. Other advantages may exist as well.

Figure 3:
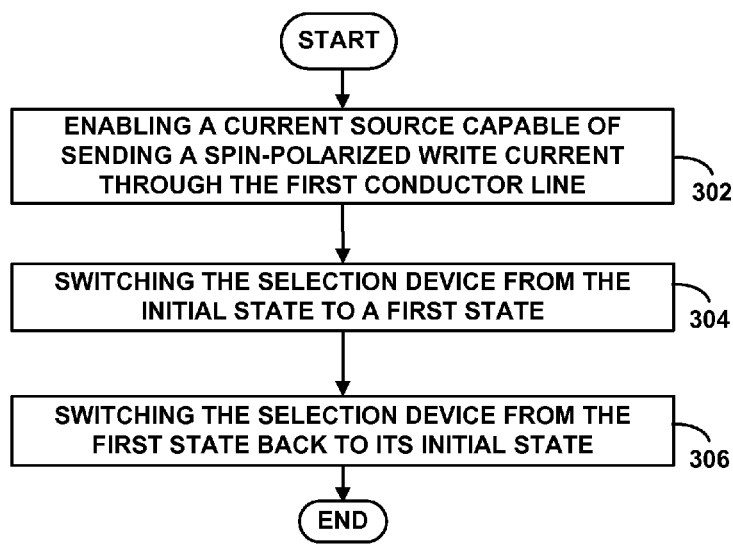
FIG. 3 depicts a method, carried out by the exemplary STT-MRAM, for performing a STT-write operation on a magnetic bit of the STT-MRAM.

FIG. 3 depicts a method, carried out by the exemplary STT-MRAM 100, for performing a STT-write operation on the magnetic bit 102. For purposes of illustration, the following description will assume that all transistors in the selection device 106 are in an initial, disabled state. The method may begin at step 302 with the STT-MRAM 100 enabling a current source capable of sending a spin-polarized write current through the first conductor line 104.

At step 304, the STT-MRAM 100 may switch the selection device 106 from the initial state to a first state. For example, in the first exemplary selection device 106 described above with reference to FIG. 2(*a*), the STT-MRAM 100 may enable at least the first transistor 202, and potentially the second transistor 204 as well. In this respect, the STT-MRAM 100 may place a high voltage on at least the first selection line $SL_1$, and potentially the second selection line $SL_2$ as well. As another example, in the second exemplary selection device 106 described above with reference to FIG. 2(*b*), the STT-MRAM 100 may fully enable the first and second transistors 202 and 204. In this respect, the STT-MRAM 100 may place a high voltage on both the first and second selection lines $SL_1$ and $SL_2$. As yet another example, in the third exemplary selection device 106 described above with reference to FIG. 2(*c*), the STT-MRAM 100 may fully enable at least the first and second transistors 202 and 204, and potentially the third and fourth transistors 206 and 208 as well. In this respect, the STT-MRAM 100 may place a high voltage on both the first and second selection lines $SL_1$ and $SL_2$, and potentially the third and fourth selection lines $SL_3$ and $SL_4$ as well. Other examples are possible as well.

As a result of switching the selection device 106 and its transistors to the first state, the spin-polarized write current may flow from the first conductor line 104 through the STT magnetic bit 102 and the enabled transistors of the selection device 106 to the write architecture (e.g., ground). In turn, the spin-polarized write current may change the polarity of the STT magnetic bit's free magnetic structure 108, thus writing data to the STT magnetic bit 102.

At step 306, the STT-MRAM 100 may then switch the selection device 106 from the first state back to its initial, disabled state. In this respect, the STT-MRAM 100 may disable all transistors in the selection device 106 such that the spin-polarized write current stops flowing through the STT magnetic bit 102, thus ending the STT-write operation. The STT-MRAM 100 may also disable the current source.

Figure 4:
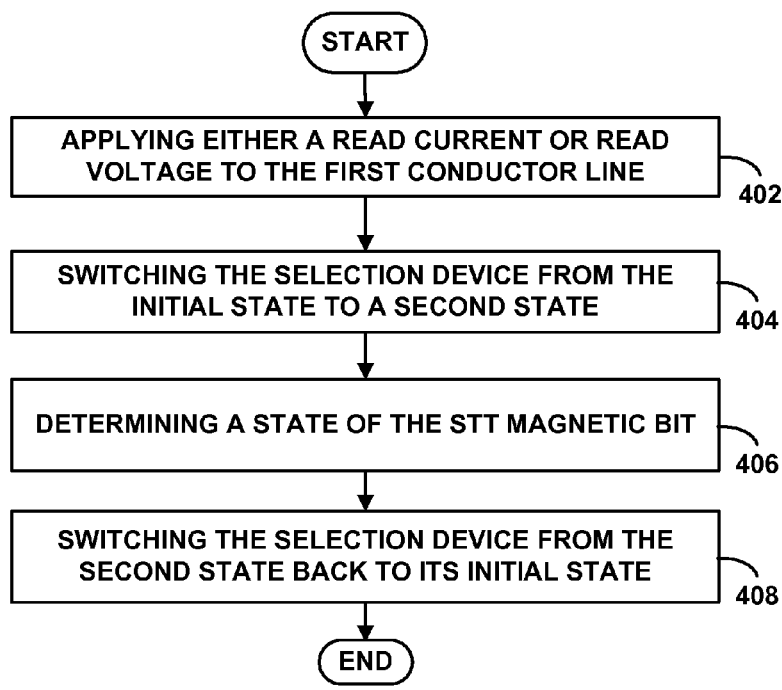
FIG. 4 depicts a method, carried out by the exemplary STT-MRAM, for performing a read operation on a magnetic bit of the STT-MRAM.

FIG. 4 depicts a method, carried out by the exemplary STT-MRAM 100, for performing a read operation on the magnetic bit 102. For purposes of illustration, the following description will assume that all transistors in the selection device 106 are in an initial, disabled state. The method may begin at step 402 with the STT-MRAM 100 applying either a read current or a read voltage to the STT magnetic bit 102.

At step 404, the STT-MRAM 100 may switch the selection device 106 to a second state. For example, in the first exemplary selection device 106 described above with reference to FIG. 2(a), the STT-MRAM 100 may enable the second transistor 204 while leaving the first transistor 202 disabled. In this respect, the STT-MRAM 100 may place a high voltage on the second selection line $SL_2$. As another example, in the second exemplary selection device 106 described above with reference to FIG. 2(b), the STT-MRAM 100 may partially enable the first transistor 202 and either partially or fully enable the second transistor 204 (or vice versa). In this respect, the STT-MRAM 100 may place an intermediate voltage on the first selection line $SL_1$ and either an intermediate or high voltage on the second selection line $SL_2$. As yet another example, in the third exemplary selection device 106 described above with reference to FIG. 2(c), the STT-MRAM 100 may enable the third transistor 206 and the fourth transistor 208 while leaving the first transistor 202 and the second transistor 204 disabled. In this respect, the STT-MRAM 100 may place a high voltage on both the third and fourth selection lines $SL_3$ and $SL_4$. Other examples are possible as well. As a result of switching the selection device 106 and its transistors to the second state, a current may flow through the STT magnetic bit 102 and the enabled transistors of the selection device 106.

At step 406, while the current is flowing through the STT magnetic bit 102 and the enabled transistors of the selection device 106, the STT-MRAM 100 may then determine the state of the STT magnetic bit 102. For example, if the STT-MRAM 100 applies a read voltage to the magnetic bit 102 at step 402, the read architecture may measure the current flowing through the STT magnetic bit 102 and the enabled transistors of the selection device 106 to determine the state of the STT magnetic bit 102. As another example, if the STT-MRAM 100 applies a read current to the magnetic bit 102 at step 402, the read architecture may then measure the voltage across the STT magnetic bit 102 to determine the state of the STT magnetic bit 102. Other examples for determining the state of the STT magnetic bit 102 may exist as well.

At step 408, the STT-MRAM 100 may then switch the selection device 106 back to its initial, disabled state. In this respect, the STT-MRAM 100 may disable all transistors in the selection device 106 such that the current stops flowing through the STT magnetic bit 102, thus ending the read operation. The STT-MRAM 100 may also stop applying the read current or read voltage to the STT magnetic bit 102.

Exemplary embodiments of the present invention have been described above. Those skilled in the art will understand, however, that changes and modifications may be made to the embodiments described without departing from the true scope and spirit of the present invention, which is defined by the claims.

I claim:

1. A spin-torque transfer magnetic random access memory (STT-MRAM) comprising:
    a first conductor line;
    a selection device; and
    a magnetic bit coupled between the first conductor line and the selection device, wherein:
        the selection device includes at least a first transistor and a second transistor arranged in a series configuration;
        the selection device is operative to select the magnetic bit for a spin-torque transfer (STT) write operation when the at least the first transistor and the second transistor are in a first state, wherein, in the first state, the first transistor and the second transistor are fully enabled; and
        the selection device is operative to select the magnetic bit for a read operation when the at least the first transistor and the second transistor are in a second state, wherein, in the second state, the first transistor is partially enabled and the second transistor is fully enabled.

2. The STT-MRAM of claim 1, wherein the selection device is implemented in silicon-on-insulator (SOI) complementary metal-oxide-semiconductor (CMOS) technology.

3. The STT-MRAM of claim 1, wherein the selection device is radiation hardened.

4. The STT-MRAM of claim 1, wherein at least the first transistor and the second transistor each have a body tie.

5. The STT-MRAM of claim 1, wherein the selection device is further operative to (a) couple a given transistor to a write architecture when at least the first transistor and the second transistor are in the first state and (b) couple the given transistor to a read architecture when at least the first transistor and the second transistor are in the second state.

6. The STT-MRAM of claim 1, wherein the series configuration is a first series configuration, and wherein the selection device comprises:
    a third transistor and a fourth transistor arranged in a second series configuration, wherein the first series configuration and the second series configuration are arranged in a parallel configuration.

7. The STT-MRAM of claim 6, wherein:
    in the first state, the third transistor and the fourth transistor are disabled.

8. The STT-MRAM of claim 6, wherein:
    in the first state, the third transistor and the fourth transistor are fully enabled.

9. A spin-torque transfer magnetic random access memory (STT-MRAM) comprising:
    a first conductor line;
    a selection device; and
    a magnetic bit coupled between the first conductor line and the selection device, wherein:
        the selection device includes a first transistor and a second transistor arranged in a parallel configuration;

the selection device is operative to select the magnetic bit for a spin-torque transfer (STT) write operation when the first transistor is enabled and the second transistor is enabled; and the selection device is operative to select the magnetic bit for a read operation when the first transistor is disabled and the second transistor is enabled.

10. The STT-MRAM of claim 9, wherein the selection device is implemented in silicon-on-insulator (SOI) complementary metal-oxide-semiconductor (CMOS) technology.

11. The STT-MRAM of claim 10, wherein the first transistor and the second transistor each have a body tie.

12. A spin-torque transfer magnetic random access memory (STT-MRAM) comprising:
   a first conductor line;
   a selection device; and
   a magnetic bit coupled between the first conductor line and the selection device, wherein:
   the selection device includes a first transistor and a second transistor arranged in a series configuration;
   the selection device is operative to select the magnetic bit for a spin-torque transfer (STT) write operation when the first transistor and the second transistor are fully enabled; and
   the selection device is operative to select the magnetic bit for a read operation when the first transistor is partially enabled and the second transistor is at least partially enabled.

13. The STT-MRAM of claim 12, wherein the selection device is implemented in silicon-on-insulator (SOI) complementary metal-oxide-semiconductor (CMOS) technology.

14. The STT-MRAM of claim 12, wherein the first transistor and the second transistor each have a body tie.

* * * * *